United States Patent [19]

Dobkin

[11] 3,886,001

[45] May 27, 1975

[54] METHOD OF FABRICATING A VERTICAL CHANNEL FET RESISTOR

[75] Inventor: Robert C. Dobkin, Menlo Park, Calif.

[73] Assignee: National Semiconductor Corporation, Santa Clara, Calif.

[22] Filed: May 2, 1974

[21] Appl. No.: 466,225

[52] U.S. Cl. .................... 148/175; 29/571; 29/576; 29/577; 29/578; 117/201; 117/213; 148/187; 357/20; 357/22; 357/51; 357/88

[51] Int. Cl. .......................... H011 7/44; H011 27/02

[58] Field of Search ...... 148/175, 187, 189; 29/571, 29/576–578; 117/201, 213; 357/20, 22, 51, 88

[56] References Cited

UNITED STATES PATENTS

| | | | |
|---|---|---|---|
| 3,414,782 | 12/1968 | Lin et al. | 357/22 X |
| 3,427,212 | 2/1969 | Allison | 148/187 |
| 3,584,266 | 6/1971 | Schilling | 357/51 X |
| 3,619,737 | 11/1971 | Chiu | 357/22 |
| 3,631,313 | 12/1971 | Moore | 357/51 |
| 3,653,988 | 4/1972 | Glinski et al. | 148/175 |

*Primary Examiner*—L. Dewayne Rutledge
*Assistant Examiner*—W. G. Saba
*Attorney, Agent, or Firm*—Lowhurst, Aine & Nolan

[57] ABSTRACT

A large value resistor is formed during the standard processing steps in the fabrication of a monolithic integrated circuit device, the resitor being formed by a vertical channel FET, the channel of the FET being formed during diffusion of the isolation regions for the device, this diffusion extending down through the epitaxial layer of the device and through a channel defining opening in a buried layer region between the epitaxial layer and the substrate of the device.

4 Claims, 4 Drawing Figures

METHOD OF FABRICATING A VERTICAL CHANNEL FET RESISTOR

BACKGROUND OF THE INVENTION

In monolithic integrated circuit devices it is often desirable to form one or more loose tolerance, relatively high value, reasonably high breakdown voltage resistors which will act, for example, as simple biasing resistors in the integrated circuit layout. In such case, it has been the practice to form such a resistor in the epitaxially grown layer of the integrated circuit device by simply utilizing the resistivity of the epitaxial material. A region of the epitaxial layer is isolated by the standard isolation diffusion, such a region typically being long and narrow. This elongated region is then provided with contacts at either end with the resistor being formed by the elongated region of epitaxial material lying between the two contacts. To reduce the cross section of the epitaxial region by a surface diffusion region taking place during the base diffusion of other devices on the substrate. Such a lateral type resistor consumes surface area on the device and an undesirably large surface area may have to be devoted to these resistors particularly where more than one such resistor is formed.

SUMMARY OF THE PRESENT INVENTION

The present invention provides a novel integrated circuit device and method for manufacture wherein a vertical type channel FET resistor is formed in the device during standard processing techniques for a monolithic integrated circuit device, this channel FET device serving as a loose tolerance, relatively high value, reasonably high breakdown voltage resistor. This vertical resistor takes up a smaller surface area of the integrated circuit device than the equivalent resistor heretofore formed in a lateral manner on the device. Since such a vertical channel FET device is formed during the standard processing steps forming the conventional transistors on the substrate, no additional steps are required to form this special vertical channel FET resistor.

DESCRIPTION OF THE PREFERRED EMBODIMENTS

Figure 1:
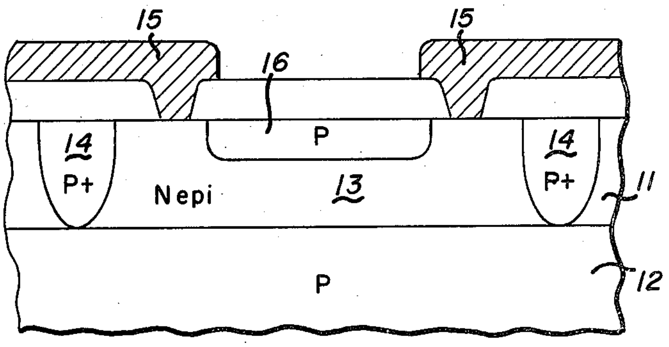
Fig 1 PRIOR ART
FIGS. 1 and 2 are side cross-section and top views, respectively, of a known form of lateral type channel FET resistor formed in accordance with standard processing techniques on a monolithic integrated circuit device.
Figure 2:
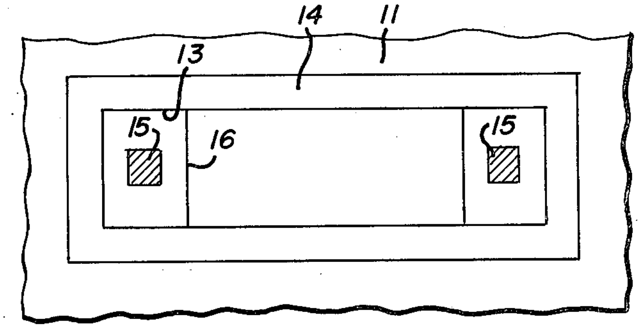
Fig 2 PRIOR ART

Referring now to FIGS. 1 and 2, there is shown a typical form of lateral type, loose tolerance resistor formed during standard processing steps in the fabrication of a monolithic integrated circuit. The resistor is formed by the material of the N epitaxial layer 11 grown on the starting P type substrate 12 of the device. As a first step, a region 13 of the N epitaxial layer is delineated by the rectangular-shaped isolation band 14 formed by the standard P+ isolation diffusion during the fabrication of the various isolation regions on the integrated circuit device. Typically, the resistor region 13 is long and narrow, for example, 15 mils long and 1.8 mils wide, which, in a typical N epitaxial layer region, will form a resistor of about 100 K. The opposite ends of the elongated N epitaxial region 13 are provided with contact 15 which form the terminal ends of the resistor. It is common practice to increase the resistance of the resistor by further reducing the cross-section area of the N epitaxial layer region 13 by forming a P diffusion region 16 in the surface of the N epitaxial region, this P diffusion region being formed at the same time that the P base diffusion regions are being formed on the various devices in the integrated circuit. Thus, there is formed an N channel FET with the N epitaxial region between the two terminal contacts serving as the channel and the P regions on the top, bottom and sides of the N epitaxial resistor region forming the gate of the channel FET.

Oftentimes it is not desirable to devote the surface area on the integrated circuit device necessary to form one or more of these lateral type resistors. The present invention, therefore, provides a vertical type channel FET resistor, the formation of which takes up substantially less of the surface area of the integrated circuit device.

Figure 3:
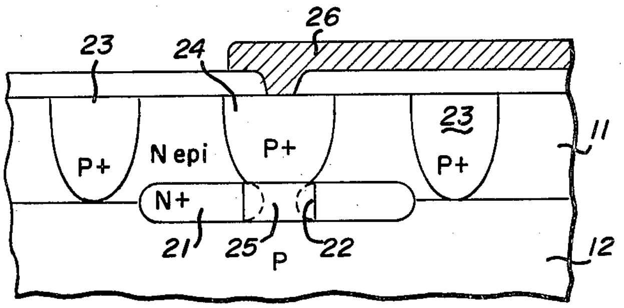
FIGS. 3 and 4 are side cross-section and top views, respectively, of a vertical type of channel FET resistor formed during standard processing steps in the manufacture of an integrated circuit device in accordance with the present invention.
Figure 4:
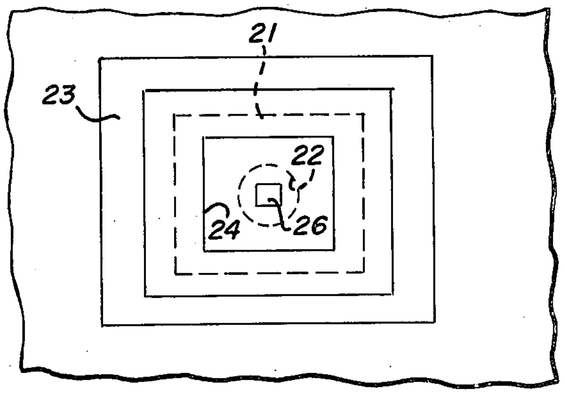

Referring now to FIGS. 3 and 4, a channel FET resistor in accordance with the present invention is shown and comprises a band 21 of N+ buried layer material diffused into the P substrate 12 of the device during the same processing step as the standard N+ buried layers are formed under the various transistor devices on the integrated circuit. In the present case, the mask of the N+ buried layer region 21 is made so that a center area or opening 22 exists in the N+ buried layer region 21, this opening region 22 being free of the heavily doped N+ material. As shown in FIG. 4, this N+ buried layer region 21 can take the form of a substantially square buried layer region with a circular hole 21 in the center thereof. Typically, the hole can be 1.1 mils in diameter. After the formation of this band-like buried layer diffusion region 21, the N epitaxial layer 11 is grown over the substrate 12 and the N+ buried layer diffusion region 21. Thereafter, the standard P+ isolation regions are formed and, in the present case, this amounts to a square type isolation band 23, for example, 3 mils by 3 mils square, surrounding the N+ buried layer region 21. At the time of diffusion of this isolation region 23, a central P+ diffusion region 24 is made aligned with the hole region 22 in the N+ buried layer 21, this central P+ diffusion 24 extending down to where its outer edges contact the upper surface of the N+ buried layer region 21 and its central region 25 extends down through the hole 22 and into contact with the P type substrate region 12. There is thus formed a P channel region 25 extending down through the N+ buried layer region, the N epitaxial region and the N+ buried layer forming the gate area of the P type channel FET. The resistor is formed by this channel region 25 and the P substrate 12 serves as one terminal of the resistor, a surface terminal 26 being provided contacting the surface of the P+ region 24 and forming the other terminal of the resistor.

Because the P substrate 12 and the conventional contact associated therewith on the IC form one terminal of the resistor, this one resistor terminal is committed to be connected to the most negative point of the integrated circuit device. The opposite surface terminal 26 of the resistor is free to be connected to any point in the circuit desired. In most cases, this is not a drawback since the biasing resistor can be utilized with this one substrate terminal already committed to the most negative point of the circuit.

It can be seen that this novel vertical channel FET resistor, which is made during the normal processing steps of an integrated circuit and which requires no special additional steps in its fabrication, takes up considerably less area of the integrated circuit and therefore is of distinct advantage when space is at a premium.

What is claimed is:

1. The method for making a channel FET in the substrate of a monolithic integrated circuit device, said substrate being of a first conductivity type, comprising the steps of, diffusing a buried layer region of a second conductivity type into the device substrate, said buried layer region being band-shaped with an opening therethrough, growing an epitaxial layer of said second conductivity type on said substrate and over said buried layer, diffusing an isolation region of said first conductivity type into said epitaxial layer around said buried layer region, diffusing a channel region of said first conductivity type into said epitaxial layer within said isolation region and down through the opening in said buried layer and into said substrate, said channel region diffusion taking place with said isolation region diffusion, and forming a surface contact with said channel region.

2. The method as claimed in claim 1 wherein said first conductivity type is P type and said second conductivity type is N type.

3. The method as claimed in claim 1 wherein said channel region is more heavily doped than said substrate.

4. The method as claimed in claim 3 wherein said first conductivity type is P type and said second conductivity type is N. type.

* * * * *